US011716826B2

United States Patent
Kamgaing et al.

(10) Patent No.: US 11,716,826 B2
(45) Date of Patent: Aug. 1, 2023

(54) PLATFORMS INCLUDING MICROELECTRONIC PACKAGES THEREIN COUPLED TO A CHASSIS, WHERE WAVEGUIDES COUPLE THE MICROELECTRONIC PACKAGES TO EACH OTHER AND USABLE IN A COMPUTING DEVICE

(71) Applicant: Intel Corporation, Santa Clara, CA (US)

(72) Inventors: Telesphor Kamgaing, Chandler, AZ (US); Johanna M. Swan, Scottsdale, AZ (US); Georgios Dogiamis, Chandler, AZ (US); Henning Braunisch, Phoenix, AZ (US); Adel A. Elsherbini, Chandler, AZ (US); Aleksandar Aleksov, Chandler, AZ (US); Richard Dischler, Bolton, MA (US)

(73) Assignee: Intel Corporation, Santa Clara, CA (US)

( * ) Notice: Subject to any disclaimer, the term of this patent is extended or adjusted under 35 U.S.C. 154(b) by 943 days.

(21) Appl. No.: 16/402,055

(22) Filed: May 2, 2019

(65) Prior Publication Data

US 2020/0315052 A1 Oct. 1, 2020

(30) Foreign Application Priority Data

Mar. 29, 2019 (GR) .............................. 20190100149

(51) Int. Cl.
*H05K 7/14* (2006.01)
*H05K 1/02* (2006.01)
*H01P 5/12* (2006.01)
*H01P 3/16* (2006.01)
*H01L 23/00* (2006.01)
*H01L 25/18* (2023.01)
*H01L 23/66* (2006.01)
(Continued)

(52) U.S. Cl.
CPC ............. *H05K 7/1489* (2013.01); *H01P 3/16* (2013.01); *H01P 5/12* (2013.01); *H05K 1/0243* (2013.01); *H01L 23/5384* (2013.01); *H01L 23/5386* (2013.01); *H01L 23/66* (2013.01); *H01L 24/16* (2013.01); *H01L 25/18* (2013.01); *H01L 2223/6616* (2013.01); *H01L 2223/6627* (2013.01); *H01L 2224/16225* (2013.01); *H05K 1/181* (2013.01); *H05K 2201/10356* (2013.01); *H05K 2201/10378* (2013.01); *H05K 2201/10734* (2013.01)

(58) Field of Classification Search
CPC .. H01P 3/16; H01P 3/121; H01P 5/024; H01P 5/08; H01P 5/087; H01P 5/107; H05K 7/1489
USPC ..................................... 333/26, 248
See application file for complete search history.

(56) References Cited

U.S. PATENT DOCUMENTS 9,350,063 B2 * 5/2016 Herbsommer et al. ... H01P 1/04
2018/0097269 A1 * 4/2018 Dogiamis et al. ...... H01P 3/122

* cited by examiner

*Primary Examiner* — Benny T Lee
(74) *Attorney, Agent, or Firm* — Akona IP PC

(57) ABSTRACT

Embodiments may relate an electronic device that includes a first platform and a second platform coupled with a chassis. The platforms may include respective microelectronic packages. The electronic device may further include a waveguide coupled to the first platform and the second platform such that their respective microelectronic packages are communicatively coupled by the waveguide. Other embodiments may be described or claimed.

19 Claims, 6 Drawing Sheets

(51) Int. Cl.
*H01L 23/538* (2006.01)
*H05K 1/18* (2006.01)

Coupling a first platform to a chassis, wherein the first platform includes a first microelectronic package
505

Coupling a second platform to the chassis, wherein the second platform includes a second microelectronic package
510

Coupling a first end of a waveguide to the first platform such that the first microelectronic package is communicatively coupled with the first end of the waveguide
515

Coupling a second end of the waveguide to the second platform such that the second microelectronic package is communicatively coupled with the second end of the waveguide
520

Figure 5

PLATFORMS INCLUDING MICROELECTRONIC PACKAGES THEREIN COUPLED TO A CHASSIS, WHERE WAVEGUIDES COUPLE THE MICROELECTRONIC PACKAGES TO EACH OTHER AND USABLE IN A COMPUTING DEVICE

CROSS REFERENCE TO RELATED APPLICATION

This application claims priority to Greek Patent Application No. 20190100149, filed Mar. 29, 2019, entitled "STACKED PLATFORMS WITH WAVEGUIDE INTERCONNECTS," the contents of which are hereby incorporated by reference in their entirety.

BACKGROUND

Rack servers and high-performance computers may use sleds or blades that are typically stacked in a rack or within a chassis of the computing device. Signaling between the different boards may occur through a combination of motherboard interconnects and cables through the chassis of the computing device, which may lead to high losses and degradation of signal quality.

BRIEF DESCRIPTION OF THE DRAWINGS

FIG. 5 depicts an example technique for manufacturing an electronic device with a plurality of platforms connected by a waveguide interconnect, in accordance with various embodiments.

DETAILED DESCRIPTION

Figure 1:
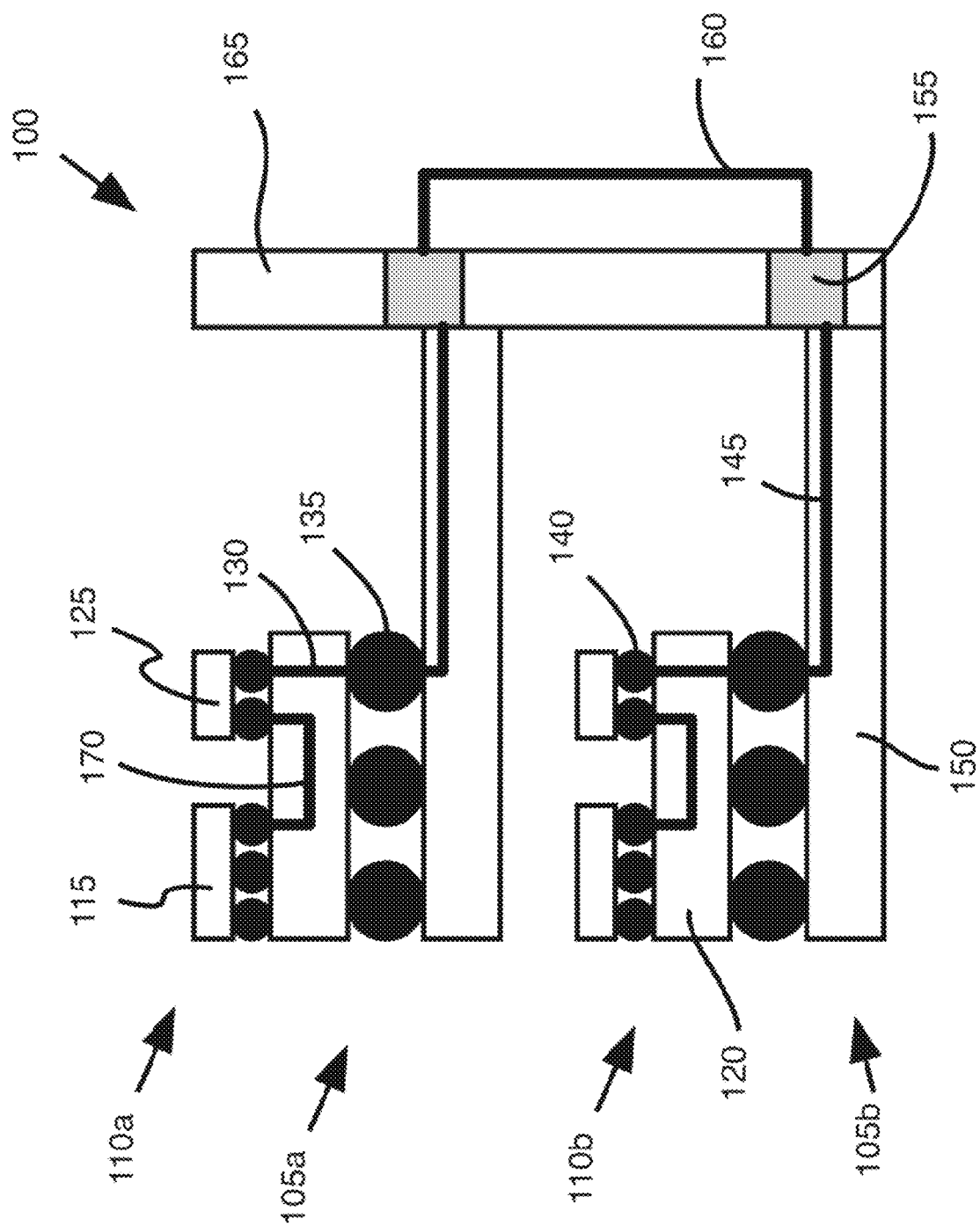
FIG. 1 depicts an example electronic device with a plurality of platforms connected by a waveguide interconnect, in accordance with various embodiments.

In the following detailed description, reference is made to the accompanying drawings which form a part hereof, wherein like numerals designate like parts throughout the detailed description of the drawings, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A or B" means (A), (B), or (A and B). For the purposes of the present disclosure, the phrase "A, B, or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with derivatives thereof, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or elements are in direct contact.

In various embodiments, the phrase "a first feature formed, deposited, or otherwise disposed on a second feature," may mean that the first feature is formed, deposited, or disposed over the feature layer, and at least a part of the first feature may be in direct contact (e.g., direct physical or electrical contact) or indirect contact (e.g., having one or more other features between the first feature and the second feature) with at least a part of the second feature.

Various operations may be described as multiple discrete operations in turn, in a manner that is most helpful in understanding the claimed subject matter. However, the order of description should not be construed as to imply that these operations are necessarily order dependent.

Embodiments herein may be described with respect to the accompanying Figures. Reference numerals having numbers beginning with one hundred (e.g., 125, 130, etc.) refer to FIG. 1. Reference numerals having numbers beginning with two hundred (e.g., 245, 250, etc.) refer to FIG. 2. Reference numerals having numbers beginning with three hundred (e.g., 345, 350, etc.) refer to FIG. 3. Reference numerals having numbers beginning with four hundred (e.g., 407, 409, etc.) refer to FIG. 4. Reference numerals having numbers beginning with five hundred (e.g., 505, 510, etc.) refer to FIG. 5. Reference numerals having numbers beginning with fifteen hundred (e.g., 1502, 1512, etc.) refer to FIG. 6. A collection of reference numerals may be designated with different numerals or letters (e.g., 105*a*, 105*b*), such a collection may be referred to herein without the numerals or letters (e.g., as "105"). Unless explicitly stated, the dimensions of the accompanying Figures are intended to be simplified illustrative examples, rather than depictions of relative dimensions. For example, various lengths/widths/heights of elements in the accompanying Figures may not be drawn to scale unless indicated otherwise. Additionally, some schematic illustrations of example structures of various devices and assemblies described herein may be shown with precise right angles and straight lines, but it is to be understood that such schematic illustrations may not reflect real-life process limitations which may cause the features to not look so "ideal" when any of the structures described herein are examined, e.g., using scanning electron microscopy (SEM) images or transmission electron microscope (TEM) images. In such images of real structures, possible processing defects could also be visible, e.g., not-perfectly straight edges of materials, tapered vias or other openings, inadvertent rounding of corners or variations in thicknesses of different material layers, occasional screw, edge, or combination dislocations within the crystalline region, and/or occasional dislocation defects of single atoms or clusters of atoms. There may be other defects not listed here but that are common within the field of device fabrication.

As noted above, rack scale servers or high-performance computers may utilize a number of platforms stacked within a rack or a chassis. The platforms may, in various embodiments, be described as "server blades," "blades," "sleds," "motherboards," etc. For the sake of ease of description, the term "platforms" will be used herein.

High-speed signaling between different platforms may occur in legacy devices through a combination of motherboard interconnects and high-speed cables plugged at the back of the chassis. However, this configuration may provide a relatively long path for the electrical signal to travel between platforms, which may result in high losses and degradation of the signal quality. In addition, the layout of the platforms may become very complex as a result of the ever-increasing bandwidth demand.

Embodiments herein may reduce motherboard complexity while also reducing the system footprint and removing the need for high-speed cabling external to the chassis. Embodiments may further reduce the length of the signal pathway while providing a higher-bandwidth interconnect. Specifically, embodiments may introduce within-chassis waveguide structures or waveguide interconnects that enable ultra-high-speed signal links between stacked platforms. In other words, embodiments may relate to three-dimensional (3D) links connecting stacked platforms. As a result, the waveguides may provide higher bandwidth density and lower losses for the platform-to-platform interconnects than legacy electrical traces. Use of the waveguide may also reduce the length of the signal path and improve the electrical performance. Additionally, the use of platform-to-platform waveguide interconnects may reduce the system footprint by implementing a vertical waveguide structure closer to a microelectronic package of the platform(s) than the legacy through-chassis electrical routing.

FIG. 1 depicts an example electronic device with a plurality of platforms connected by a waveguide interconnect, in accordance with various embodiments. Specifically, FIG. 1 may depict an electronic device 100 that includes two platforms 105a and 105b (collectively, platforms 105). The platforms 105 may be considered to be in a "stacked" configuration. The platforms 105a and 105b may respectively include microelectronic packages 110a and 110b (collectively, microelectronic packages 110). In some embodiments, the microelectronic packages 110 may also be referred to as semiconductor packages. It will be noted that each and every element of FIG. 1 (and the subsequent FIGS. 2 to 6 herein) may not be specifically notated, and this is done for the sake of clarity and lack of un-necessary redundancy. It will be understood, however, that similar elements between the various FIGS. 1 to 6, or within an individual FIGS. 1 to 6, may share characteristics with one another unless otherwise stated.

Generally, the microelectronic packages 110 may include a die 115, a transceiver chip 125, and a package substrate 120. The package substrates 120 may be cored or coreless. In various embodiments, the package substrates 120 may include one or more layers of an organic or inorganic dielectric material. The dielectric material may be, for example, a build-up film made of silica-filled epoxy, low temperature co-fired ceramic, glass or some other appropriate dielectric material. The package substrates 120 may also include one or more electrically conductive elements such as traces, pads, vias, etc. that may route signals from one area or element of the package substrate 120 to another. Such a via may be via 130, which may communicatively couple an element at one side of the package substrate 120 with another side of the package substrate 120. Generally, the via 130 may be a plated via, a plated via stack or some other type of via that allows for electrical communication between two elements. It will be understood that although only a single via 130 is depicted as performing this function, in other embodiments the coupling may include a plurality of vias, traces, etc. In various embodiments, the package substrates 120 may include one or more active or passive elements either positioned within the package substrates 120, or coupled to the package substrates 120. However, these extra elements are not depicted in FIG. 1 for the sake of avoidance of clutter of the Figure.

The dies 115 may include one or more active or passive elements. The active elements may be or include a singular or distributed processor, one or more cores of a distributed processor, a memory, etc. The processor may be, for example, a central processing unit (CPU), a graphics processing unit (GPU), network controller or some other type of processor. The memory may be, for example, a non-volatile memory (NVM), a dynamic random-access memory (DRAM), a double data rate (DDR) memory, etc. The passive element may include or be a resistor, a capacitor, an inductor, etc. In embodiments, the dies 115 of microelectronic packages 110a and 110b may be the same sort of die as one another (e.g., both may be a processor, or a memory, or a passive component, etc.), whereas in other embodiments the die 115 of microelectronic package 110a may be a different type of die than the die 115 of microelectronic package 110b.

The microelectronic packages 110 may also include one or more transceivers 125. Generally, and as will be described in greater detail below, the transceivers 125 may be communicatively coupled with the dies 115 by one or more conductive elements such as communication pathway 170. As depicted, the communication pathway may be generally viewed as including two vias and a trace within the package substrate 120, however it will be understood that other embodiments may include a communication pathway with more or fewer elements. The communication pathway may include a transmission line designed to meet certain characteristic impedance or to minimize the signal losses along the pathway. The elements that make up the communication pathway 170 may include pads, traces, vias, microstrips, striplines, etc. that allow for electrical communication between two elements of the microelectronic package 110.

A transceiver 125 may be configured to receive an electronic signal from the die 115, and then modulate, up-convert, or otherwise alter the electronic signal to a high-frequency electronic signal. The high-frequency electronic signal may have a frequency on the order of a mmWave-frequency, a THz-frequency, or higher. The transceiver 125 may then output the high-frequency electronic signal. Additionally or alternatively, a transceiver 125 may be configured to receive a high-frequency electronic signal and then de-modulate, down-convert, or otherwise alter the high-frequency electronic signal to a lower-frequency electronic signal which may then be output to a die 115.

Generally, the microelectronic packages 110 may include a number of interconnects 135 and 140. The interconnects 140 may physically and communicatively couple the dies 115 and the transceiver 125 to the package substrate 120. Similarly, the interconnects 135 may physically and communicatively couple the package substrate 120 to a printed circuit board (PCB) 150 of the platform 105. As depicted, the interconnects 135 and 140 may be solder bumps. For example, the interconnects 135 and 140 may be solder balls of a ball grid array (BGA). In other embodiments one or both of the interconnects 135 and 140 may be pins of a pin grid array (PGA), elements of a land grid array, etc. In some embodiments one or both of the interconnects 135 and 140 may additionally or alternatively include a socket mechanism, a clamp mechanism, etc. which may serve to physically couple two elements of the microelectronic packages 110. As can be seen, in some embodiments the interconnects 140 may be generally smaller than, and have a smaller pitch (i.e., the distance from the center of one interconnect 140 to another interconnect 140) than interconnects 135. However, in other embodiments the interconnects 140 may be a similar size to, or larger than, interconnects 135. Similarly, interconnects 140 may have a pitch that is similar to, or larger than, interconnects 135. Similarly, interconnects 140 may not be the same type as interconnects 135. Additionally, interconnects 140 coupled with die 115 may not be the same size or type as the interconnects 135. Finally, the interconnects 140 or the interconnects 135 of microelectronic package 110*a* may not be the same size or type as the interconnects 140 or 135 of microelectronic package 110*b*.

The PCB 150 may include a material, combination of materials, or structures similar to those of the package substrate 120. Specifically, the PCB 150 may be cored or coreless, include organic or inorganic material, include additional passive or active elements, include additional conductive elements or communications pathways, etc.

The PCBs 150 may be coupled with a chassis 165. The chassis 165 may be formed of a rigid material such as steel, plastic, etc. Generally, the chassis 165 may give structure to the computing device and secure the platforms 105 in a stacked configuration. The platforms 105 may connect to the chassis 165 via slots, sockets, or some other connection type. In some embodiments, the chassis 165 may include cabling, a backplane, or a midplane to route signals or power to or from the platforms 105.

The PCBs 150 of the platforms 105 may be communicatively coupled with the chassis 165 by waveguides 145. The waveguide 145 may include a dielectric material or some other material that allows a high-frequency signal to propagate from the interconnect 135 to the chassis 165 (or vice-versa). The waveguide 145 may be formed of a dielectric material such as polytetrafluoroethylene (PTFE), polyethylene (PE), polystyrene, cyclic-olefin-copolymers (CoC), fluoropolymers such as fluorinated ethylene propylene (FEP), ethylene tetrafluoroethylene (ETFE), polyvinylidene fluoride (PVDF) or some other dielectric material that may allow for relatively efficient and low-loss propagation of high-frequency electromagnetic signals. In some embodiments the waveguide 145 may be formed of a dielectric material as core and another dielectric material as clad, whereas in other embodiments the waveguide 145 may be metal-clad. In some embodiments, the waveguide 145 (or other waveguides herein) may be a low-dispersion waveguide such as a ridge waveguide, an H-waveguide, or some other waveguide where at least a portion of the dielectric material has a graded or stepped index.

The waveguide 145 of the PCB 150 may be coupled with a connector 155 of the chassis 165. Although the connector 155 is depicted as a simplified rectangular element, the connector 155 may include one or more electrical sockets and may further include electrical circuitry.

The connectors 155 may be coupled with a second waveguide 160. Generally, the waveguide 160 may be a flexible waveguide cable. However, in other embodiments the waveguide 160 may be a rigid element that communicatively couples the connectors 155. Additionally, although the waveguide 160 is depicted in a location external to the chassis 165 and opposite the platforms 105, in other embodiments the waveguide 160 may be internal to the chassis 165 or located in a different place than depicted in FIG. 1.

An example of the operation of the electronic device 100 may be as follows. Generally, the die 115 of microelectronic package 100*a* may generate a baseband signal, which may be communicated by communication pathway 170 to the transceiver 125. The transceiver 125 may perform one or more of the above-described operations to alter the baseband signal and produce a high-frequency signal. As used herein, "high-frequency" may refer to a signal with a frequency at or above approximately 20 gigahertz (GHz). For example, the high-frequency signal may be a millimeter wave (mm-Wave) signal which may have a frequency between approximately 20 GHz and approximately 300 GHz. Alternatively, the high-frequency signal may be referred to as a "terahertz (THz)-wave signal" with a frequency above 300 GHz, for example on the order of approximately 1 THz. In some embodiments the high-frequency signal may have a frequency between approximately 100 GHz and approximately 200 GHz.

The high-frequency signal may be transmitted from transceiver 125, through via 130, to waveguide 145 of the platform 105*a*. The package substrate 120 or the PCB 150 may include a signal launcher (not shown) which may alter the mode of the high-frequency signal from a mode appropriate for propagation through the microelectronic package 110*a* to a mode appropriate for propagation through the waveguide 145. The high-frequency signal may be conveyed along waveguide 145, through connector 155, and to waveguide 160. The high-frequency signal may then be conveyed through another connector 155 into the waveguide 145 of platform 105*b*. The high-frequency signal may propagate to microelectronic package 110*b*, and specifically transceiver 125 of microelectronic package 110*b* where it may be converted to a baseband signal that is supplied to the die 115 of microelectronic package 110*b*.

It will be understood that this description of FIG. 1, and the operation of FIG. 1, is intended as one example of various embodiments. Other embodiments may include one or more variations. For example, some embodiments may include more or fewer elements (for example dies 115, platforms 105, microelectronic packages 110 on a given platform 105, number of interconnects, etc.) than depicted in FIG. 1. Also, certain elements may have different shapes, sizes, or relative configurations than depicted in FIG. 1. In some embodiments certain elements may have a different specific configuration. For example, the connectors 155 of FIG. 1 or some other embodiment herein may include a connector element on the waveguide (e.g., waveguide 145) and a connector element on the chassis 165 such that one connector element may be "plugged in" to the other. Other variations may be present. In some embodiments, one or both of the microelectronic packages 110 may include an overmold material, a heatsink, and underfill material, or some other material which may not be depicted in FIG. 1 but which may be present in various microelectronic packages. Similar variations may be present in other Figures discussed herein.

Figure 2:
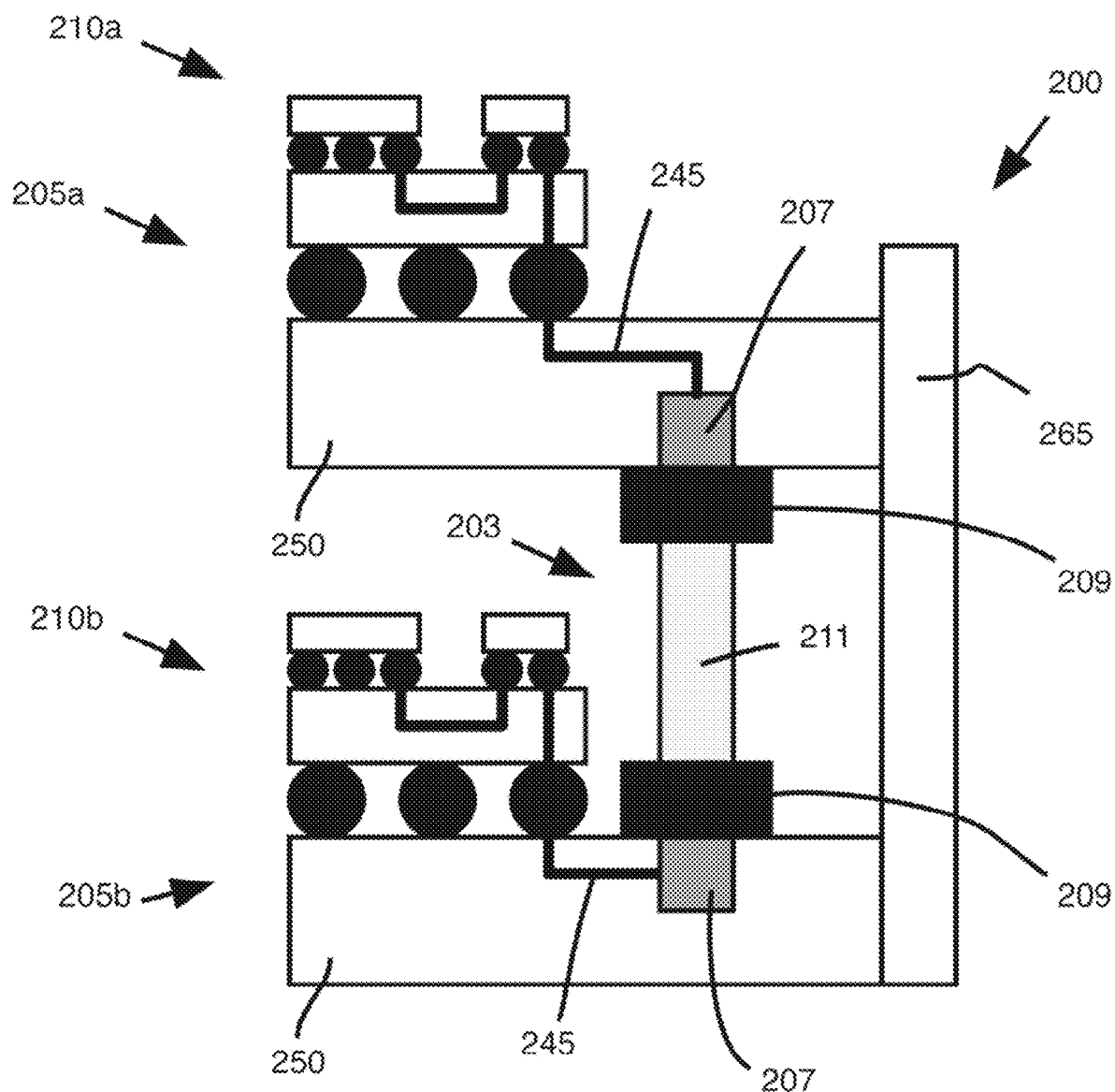
FIG. 2 depicts an alternative example electronic device with a plurality of platforms connected by a waveguide interconnect, in accordance with various embodiments.

FIG. 2 depicts a simplified view of an alternative embodiment that has a waveguide assembly connecting two adjacent platforms. The waveguide assembly may include one or more in-board signal launchers, one or more connectors, and a waveguide. In some embodiments, the waveguide assembly may be placed close to the edge of the microelectronic packages of the platform to reduce the overall footprint of the platforms or the electronic device.

Specifically, FIG. 2 depicts an alternative example electronic device 200 with a plurality of platforms connected by a waveguide interconnect, in accordance with various embodiments. The electronic device 200 may include platforms 205a and 205b (collectively platforms 205), which may be respectively similar to, and share one or more characteristics of, platforms 105a and 105b as depicted in FIG. 1. The platforms 205 may include microelectronic packages 210a and 210b (collectively microelectronic packages 210), which may be respectively similar to, and share one or more characteristics of, microelectronic packages 110a and 110b as depicted in FIG. 1. The platforms 205 may further include PCBs 250 and be coupled to a chassis 265, which may be respectively similar to, and share one or more characteristics of, PCBs 150 and chassis 165 as depicted in FIG. 1.

The electronic device may include a waveguide assembly 203 that both physically and communicatively couples platform 205a with platform 205b. The waveguide assembly 203 may include signal launchers 207, connectors 209, and a waveguide 211.

The signal launchers 207 may be similar to the signal launcher described above with respect to FIG. 1. Specifically, the signal launchers 207 may alter a high-frequency signal from a mode appropriate to propagation through a microelectronic package 210 or a platform 205 to a mode appropriate to propagation through waveguide 211 (or vice-versa). The signal launcher 207 may include, for example, an antenna, opposing metal plates, a microstrip-to-tapered-slotline launcher, a leaky-wave planar launcher, or some other type of signal launcher.

The connectors 209 may be, for example, a socket or some other type of guide which may physically and communicatively couple the waveguide 211 to the signal launcher 207. A connector 209 may be, for example, a hollow element designed to physically hold the waveguide 211 and the signal launcher 207 in a specific relative configuration. In other embodiments, a connector 209 may be or may include, for example, circuitry, lenses, etc. designed to affect the signal between the signal launcher 207 and the waveguide 211. In some embodiments, a connector 209 and a signal launcher 207 may be at least partially the same element as one another. The signal launcher 207 may be communicatively coupled with a microelectronic package 210 by a waveguide 245, which may be similar to, and share one or more characteristics of, waveguide 145 (FIG. 1).

Similarly to waveguide 145 (FIG. 1) and 245, waveguide 211 may include PTFE, PE, polystyrene, CoC, FEP, ETFE, PVDF, or some other dielectric material that may allow for relatively efficient and low-loss propagation of high-frequency electromagnetic signals such as those produced by signal launchers 207. In some embodiments the waveguide 211 may additionally or alternatively include a plug-on dielectric rod made out of a material such as glass, ceramic, etc. In some embodiments the waveguide 211 may be formed of the same material as waveguides 145 or 245, whereas in other embodiments the waveguide 211 may be formed of a different material than waveguides 145 or 245. In some embodiments, the waveguide 211 may be formed of a dielectric material without additional cladding, whereas in other embodiments the waveguide 211 may be metal-clad. In some embodiments the waveguide 211 may be a low-dispersion waveguide as described above. It will be understood that although the waveguide 211 is depicted as a unitary element, in some embodiments the waveguide 211 may be replaced by a plurality of waveguides in parallel. In some embodiments, the waveguide 211 may include a single waveguide channel which is able to carry a single high-frequency signal between the platforms 205, whereas in other embodiments the waveguide 211 may include a plurality of waveguide channels that are able to simultaneously carry a plurality of high-frequency signals between the platforms 205.

Figure 3:
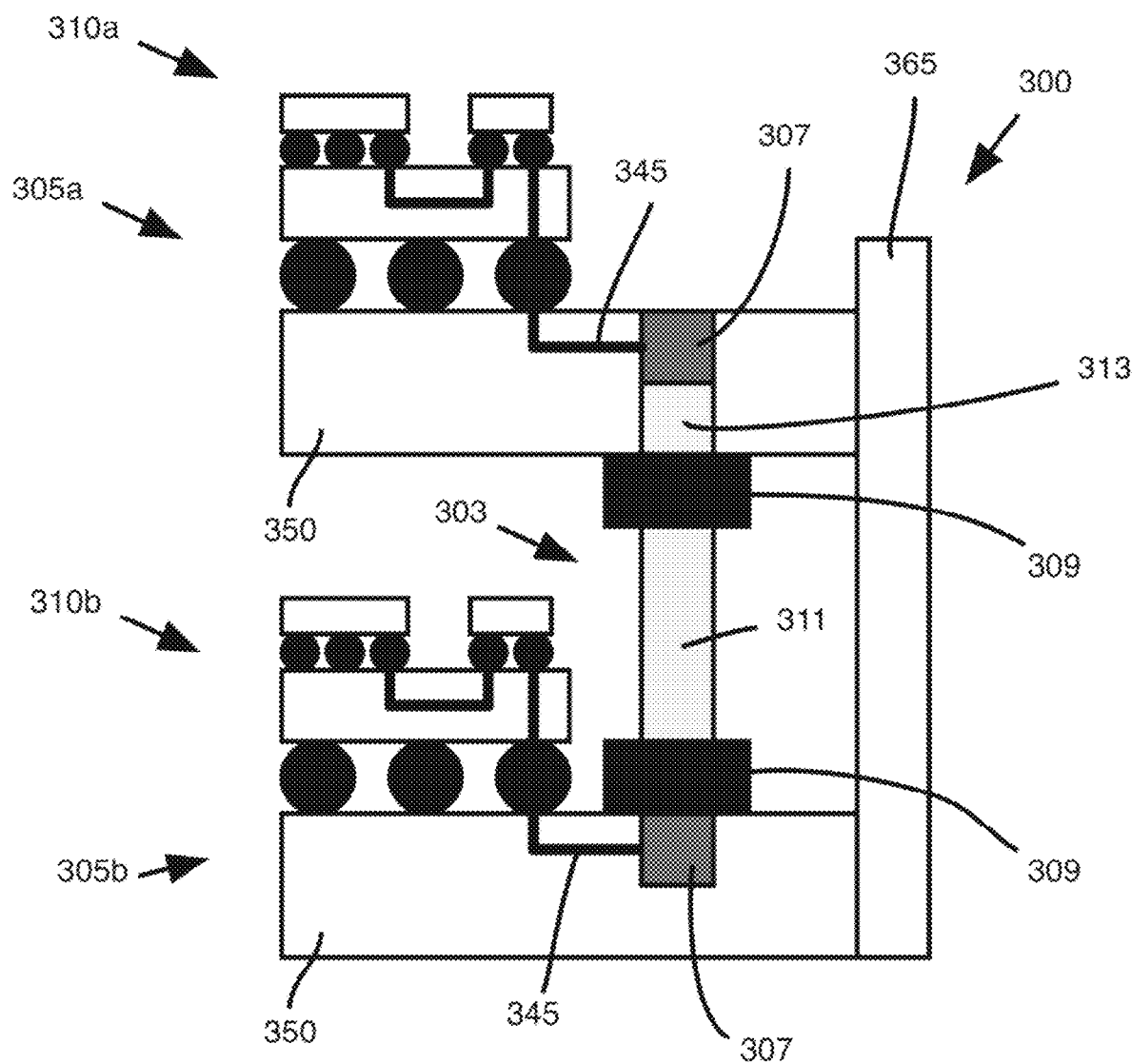
FIG. 3 depicts an alternative example electronic device with a plurality of platforms connected by a waveguide interconnect, in accordance with various embodiments.

FIG. 3 depicts an alternative example electronic device 300 with a plurality of platforms connected by a waveguide interconnect, in accordance with various embodiments. The electronic device 300 may include platforms 305a and 305b (collectively platforms 305), which may be respectively similar to, and share one or more characteristics of, platforms 105a and 105b as depicted in FIG. 1. The platforms 305 may include microelectronic packages 310a and 310b (collectively microelectronic packages 310), which may be respectively similar to, and share one or more characteristics of, microelectronic packages 110a and 110b as depicted in FIG. 1. The platforms 305 may further include PCBs 350 and be coupled to a chassis 365, which may be respectively similar to, and share one or more characteristics of, PCBs 150 and chassis 165 as depicted in FIG. 1. The PCBs 350 may also include waveguides 345, which may be similar to, and share one or more characteristics of, waveguides 145 (FIG. 1) or 245 (FIG. 2).

Additionally, the electronic device 300 may include a waveguide assembly 303, which may be similar to, and share one or more characteristics of, waveguide assembly 203 as depicted in FIG. 2. Specifically, the waveguide assembly 303 may include signal launchers 307, connectors 309, and waveguide 311, which may be respectively similar to, and share one or more characteristics of, signal launchers 207, connectors 209, and waveguides 211 as depicted in FIG. 2.

However, as can be seen, the signal launcher 307 may be placed at a location within the PCB 350 of platform 305a that is different than the location of the signal launcher 207 in the PCB 250 of platform 205a (FIG. 2). Specifically, the signal launcher 307 may not be directly adjacent to the connector 309. In this embodiment, it may be desirable to include an on-platform waveguide 313. The on-platform waveguide 313 may be formed of a material similar to those described above with respect to waveguide 311, and be communicatively coupled to both signal launcher 307 of platform 305a and waveguide 311. In some embodiments the on-platform waveguide 313 may be formed of a dielectric material or materials without metal cladding, whereas in other embodiments the waveguide 313 may be metal-clad. In some embodiments, the on-platform waveguide 313 may be manufactured as part of the manufacturing process of the PCB 350, whereas in other embodiments the on-platform waveguide 313 may be inserted into a cavity of the PCB 350 subsequent to manufacture of the PCB 350.

Some embodiments may relate to an electronic device with a plurality of platforms. In these embodiments, the waveguide assembly may go across a plurality of PCBs, and splitters may be introduced to couple the signal from within the waveguide assembly to individual platforms of the electronic device. In these embodiments, the waveguide assembly may support data transfer rates on the order of tens to hundreds of gigabits per second (Gbps), and multiple waveguide channels within the waveguide assembly may be used in parallel for board to board communication.

Figure 4:
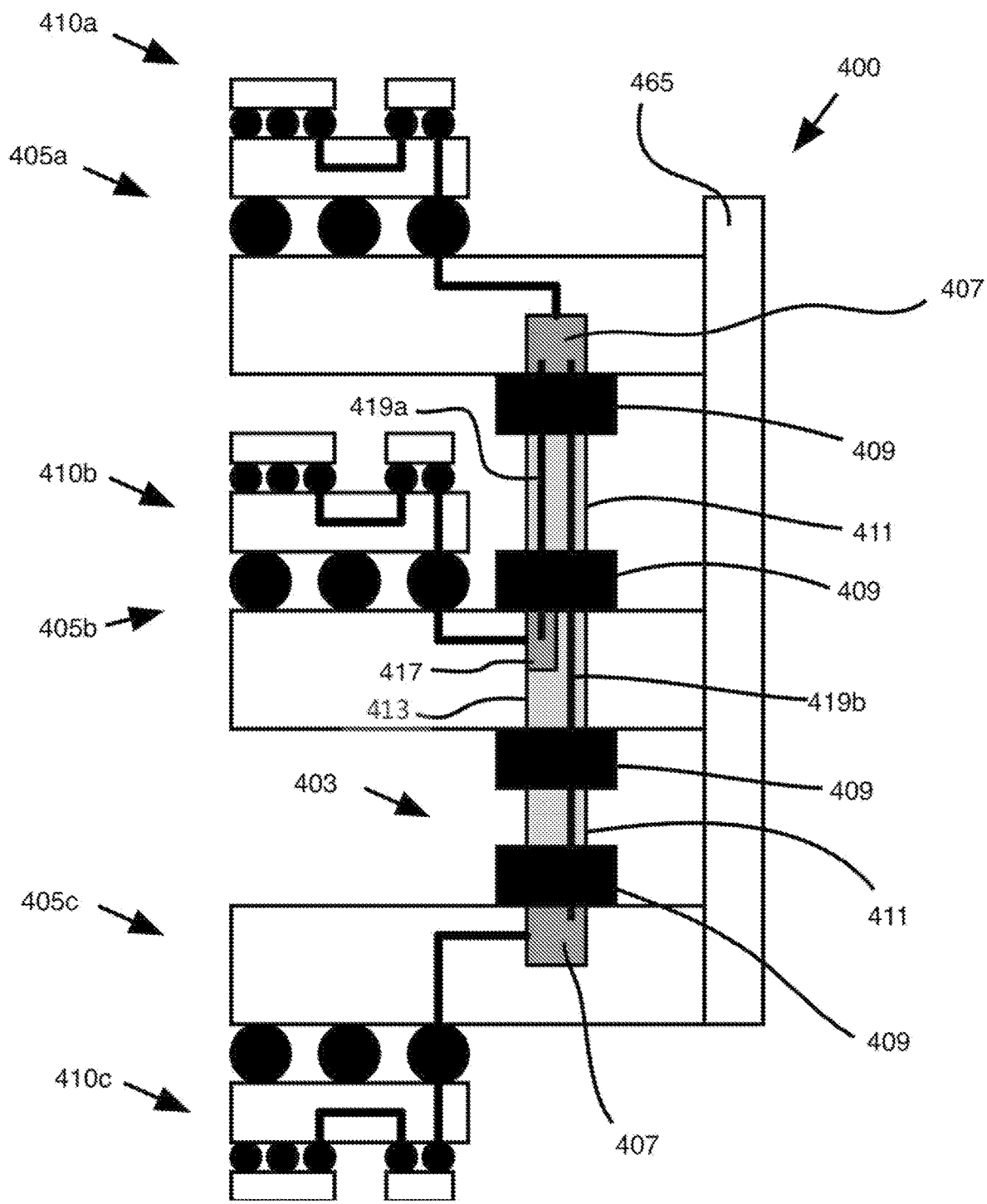
FIG. 4 depicts an alternative example electronic device with a plurality of platforms connected by a waveguide interconnect, in accordance with various embodiments.

FIG. 4 depicts an alternative example electronic device 400 with a plurality of platforms connected by a waveguide interconnect, in accordance with various embodiments. The electronic device 400 may include microelectronic packages 410a and 410b, which may be similar to, and share one or more characteristics of, microelectronic packages 210a/310a and 210b/310b as depicted in FIGS. 2 and 3, respectively. The electronic device 400 may further include platforms 405a and 405b, which may be similar to, and share one or more characteristics of, platforms 205a/305a and 205b/305b as depicted in FIGS. 2 and 3, respectively. The electronic device 400 may further include a chassis 465 which may be similar to, and share one or more characteristics of, chassis 265/365 as depicted in FIGS. 2 and 3, respectively.

Additionally, the electronic device 400 may include a platform 405c with a microelectronic package 410c. The platform 405c may be similar to, and share one or more characteristics of, platforms 405a or 405b. The platforms 405a, 405b, and 405c may be collectively referred to herein as platforms 405. Similarly, the microelectronic package 410c may be similar to, and share one or more characteristics of, microelectronic packages 410a or 410b. The microelectronic packages 410a, 410b, and 410c may be collectively referred to herein as microelectronic packages 410. As can be seen, the orientation of the platform 405c may differ from that of platforms 405a and 405b. Specifically, the platform 405c, and the microelectronic package 410c, may be considered to be "flipped" or "inverted" from that of platforms 405a and 405b. The configuration of platforms 405b and 405c may be referred to as a "back-to-back" configuration, whereas the configuration of platforms 405a and 405b may be referred to as a "back-to-face" configuration. It will, however, be understood that these configuration variations are intended as non-limiting examples. In other embodiments the configuration of the platforms 405, or the platforms 105, 205, or 305 as depicted in FIGS. 1, 2, and 3, respectively, may be different in other embodiments and certain of the platforms may be arranged in a back-to-back, back-to-face, or a "face-to-face" configuration. Although not explicitly depicted in FIG. 4, the face-to-face configuration may refer to a configuration wherein the microelectronic packages of the platforms are generally facing one another. The specific arrangement of the platforms or the microelectronic packages may be based on factors such as system design, manufacturing capabilities, other interconnects, material characteristics, or other factors.

The electronic device 400 may further include a waveguide assembly 403, which may be similar to, and share one or more characteristics of, waveguide assemblies 203 or 303 as depicted in FIGS. 2 and 3, respectively. Specifically, the waveguide assembly 403 may include signal launchers 407, waveguides 411, on-platform waveguide 413, and connectors 409, which may be respectively similar to, and share one or more characteristics of, signal launchers 207/307, waveguides 211/311, on-platform waveguide 313, and connectors 209/309 as depicted in FIGS. 2 and 3, respectively.

The waveguide assembly 403, and specifically the waveguides 411 and on-platform waveguide 413, may include a plurality of waveguide channels 419a and 419b (collectively waveguide channels 419). The waveguide channels 419 may allow a high-frequency signal to propagate through the waveguide assembly 403 between two components of the electrical device 400. Generally, a waveguide channel 419 may be composed of a dielectric material such as those described above with respect to waveguide 211 (FIG. 2) embedded within a dielectric material that may not facilitate propagation of the high-frequency signal. In this way, multiple waveguide channels 419 may be present in parallel within a waveguide assembly 403 as shown in FIG. 4.

Specifically, in some embodiments a waveguide channel such as waveguide channel 419a may provide communication between platforms 405a and 405b. Another waveguide channel 419 may provide communication between platforms 405a and 405c while passing through platform 405b as shown.

The platform 405b may include a splitter 417 which may serve as a termination for waveguide channel 419a and allow for the signal to pass between the waveguide channel 419a and the platform 405b. The splitter 417 may, in some embodiments, be constructed similarly to, or include elements similar to, signal launchers 407. Specifically, the splitter 417 may allow for or facilitate conversion of the high-frequency signal between a mode appropriate for propagation through the waveguide channel 419a and a mode appropriate for propagation through the platform 405b.

As previously noted, the above FIGS. 1-4 may be considered to be examples of various embodiments. Other embodiments may include more or fewer elements than depicted, elements with a different size than depicted, or elements in a different arrangement than depicted. Some embodiments may include combinations of aspects of the various Figures. Other variations may be present.

FIG. 5 depicts an example technique for manufacturing an electronic device with a plurality of platforms connected by a waveguide interconnect, in accordance with various embodiments. An embodiment of the technique is described with respect to FIG. 5, however it will be understood that the technique may be adapted, in whole or in part, with or without modification, to generate different electronic devices in accordance with this disclosure.

The technique may include coupling, at 505, a first platform to a chassis, wherein the first platform includes a first microelectronic package. The first platform may be similar to, for example, one of platforms 105, 205, 305, or 405 as depicted in FIGS. 1, 2, 3, and 4, respectively. The chassis may be similar to, for example, chassis 165, 265, 365, or 465 as depicted in FIGS. 1, 2, 3, and 4, respectively. The first microelectronic package may be similar to, for example, one of microelectronic packages 110, 210, 310, or 410 as depicted in FIGS. 1, 2, 3, and 4, respectively.

The technique may further include coupling, at 510, a second platform to the chassis, wherein the second blade includes a second microelectronic package. The second platform may be similar to, for example, another one of platforms 105, 205, 305, or 405. The second microelectronic package may be similar to, for example, another one of microelectronic packages 110, 210, 310, or 410.

The technique may further include coupling, at 515, a first end of a waveguide to the first platform such that the first microelectronic package is communicatively coupled with the first end of the waveguide. The waveguide may be, for example, waveguide 160 or one of waveguide assemblies 203, 303, or 403 as depicted in FIGS. 2, 3, and 4, respectively.

The technique may further include coupling, at 520, a second end of the waveguide to the second platform such that the second microelectronic package is communicatively coupled with the second end of the waveguide. As a result, the first microelectronic package may be communicatively coupled with the second microelectronic package.

Figure 6:
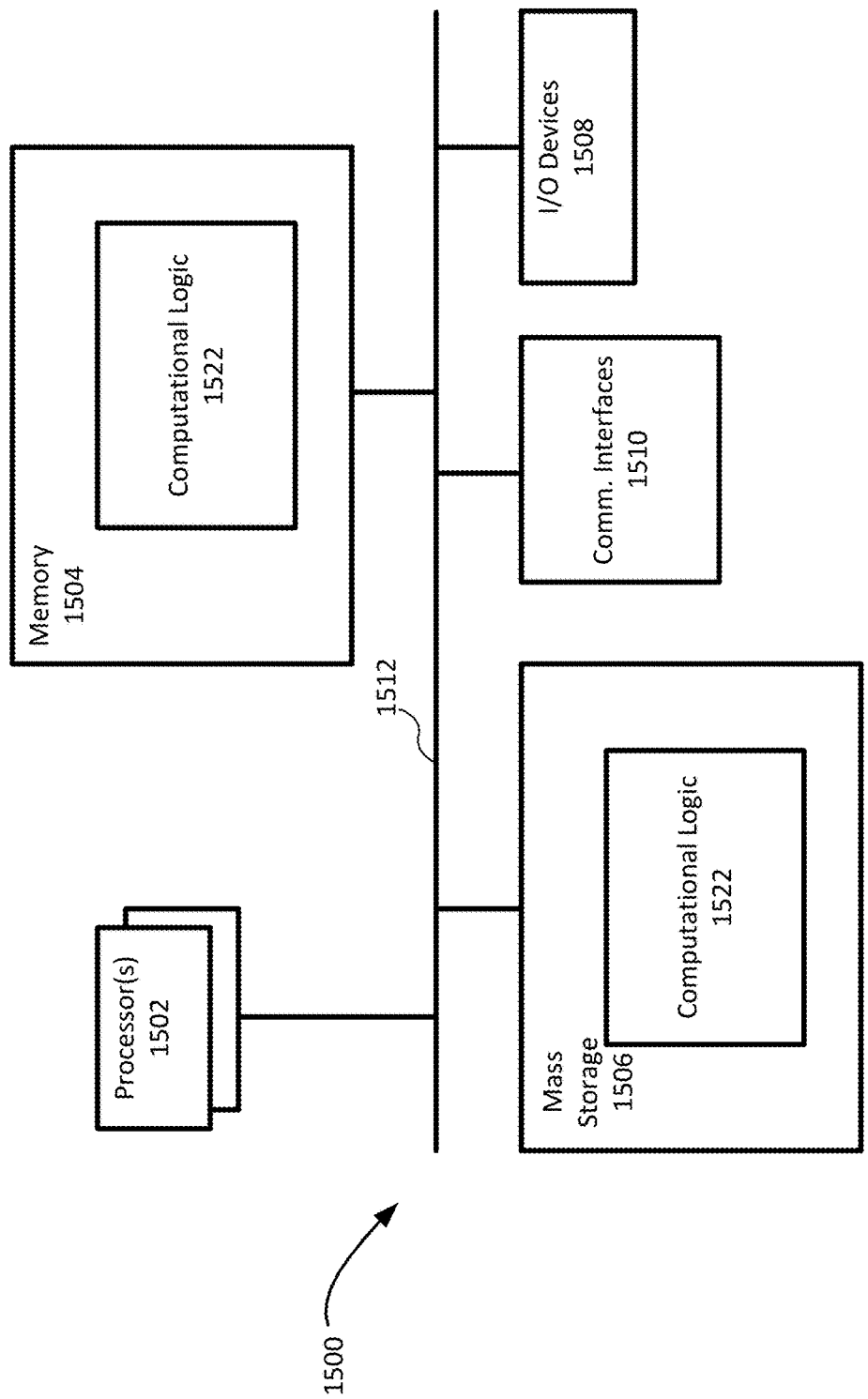
FIG. 6 illustrates an example device that may use various embodiments herein, in accordance with various embodiments.

FIG. 6 illustrates an example computing device 1500 suitable for use with various embodiments herein. As shown, computing device 1500 may include one or more processors or processor cores 1502 and system memory 1504. For the purpose of this application, including the claims, the terms "processor" and "processor cores" may be considered synonymous, unless the context clearly requires otherwise. The processor 1502 may include any type of processors, such as a CPU, a microprocessor, and the like. The processor 1502 may be implemented as an integrated circuit having multi-cores, e.g., a multi-core microprocessor. The computing device 1500 may include mass storage devices 1506 (such as diskette, hard drive, volatile memory (e.g., DRAM, compact disc read-only memory (CD-ROM), digital versatile disk (DVD), and so forth)). In general, system memory 1504 and/or mass storage devices 1506 may be temporal and/or persistent storage of any type, including, but not limited to, volatile and non-volatile memory, optical, magnetic, and/or solid state mass storage, and so forth. Volatile memory may include, but is not limited to, static and/or DRAM. Non-volatile memory may include, but is not limited to, electrically erasable programmable read-only memory, phase change memory, resistive memory, and so forth. In some embodiments, one or both of the system memory 1504 or the mass storage device 1506 may include computational logic 1522, which may be configured to implement or perform, in whole or in part, one or more instructions that may be stored in the system memory 1504 or the mass storage device 1506. In other embodiments, the computational logic 1522 may be configured to perform a memory-related command such as a read or write command on the system memory 1504 or the mass storage device 1506.

The computing device 1500 may further include input/output (I/O) devices 1508 (such as a display (e.g., a touchscreen display), keyboard, cursor control, remote control, gaming controller, image capture device, and so forth) and communication interfaces 1510 (such as network interface cards, modems, infrared receivers, radio receivers (e.g., Bluetooth), and so forth).

The communication interfaces 1510 may include communication chips (not shown) that may be configured to operate the device 1500 in accordance with a Global System for Mobile Communication (GSM), General Packet Radio Service (GPRS), Universal Mobile Telecommunications System (UMTS), High-Speed Packet Access (HSPA), Evolved HSPA (E-HSPA), or Long-Term Evolution (LTE) network. The communication chips may also be configured to operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chips may be configured to operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication interfaces 1510 may operate in accordance with other wireless protocols in other embodiments.

The computing device 1500 may further include or be coupled with a power supply. The power supply may, for example, be a power supply that is internal to the computing device 1500 such as a battery. In other embodiments the power supply may be external to the computing device 1500. For example, the power supply may be an electrical source such as an electrical outlet, an external battery, or some other type of power supply. The power supply may be, for example alternating current (AC), direct current (DC) or some other type of power supply. The power supply may in some embodiments include one or more additional components such as an AC to DC convertor, one or more down-converters, one or more upconverters, transistors, resistors, capacitors, etc. that may be used, for example, to tune or alter the current or voltage of the power supply from one level to another level. In some embodiments the power supply may be configured to provide power to the computing device 1500 or one or more discrete components of the computing device 1500 such as the processor(s) 1502, mass storage 1506, I/O devices 1508, etc.

The above-described computing device 1500 elements may be coupled to each other via system bus 1512, which may represent one or more buses. In the case of multiple buses, the buses may be bridged by one or more bus bridges (not shown). Each of these elements may perform respective conventional functions known in the art. The various elements may be implemented by assembler instructions supported by processor(s) 1502 or high-level languages that may be compiled into such instructions.

The permanent copy of the programming instructions may be placed into mass storage devices 1506 in the factory, or in the field, through, for example, a distribution medium (not shown), such as a compact disc (CD), or through communication interface 1510 (from a distribution server (not shown)). That is, one or more distribution media having an implementation of the agent program may be employed to distribute the agent and to program various computing devices.

The number, capability, and/or capacity of the elements 1508, 1510, 1512 may vary, depending on whether computing device 1500 is used as a stationary computing device, such as a set-top box or desktop computer, or a mobile computing device, such as a tablet computing device, laptop computer, game console, or smartphone. Their constitutions are otherwise known, and accordingly will not be further described.

In various implementations, the computing device 1500 may comprise one or more components of a data center, a laptop, a netbook, a notebook, an ultrabook, a smartphone, a tablet, a personal digital assistant (PDA), an ultra mobile PC, a mobile phone, or a digital camera. In further implementations, the computing device 1500 may be any other electronic device that processes data.

The computing device 1500 may be configured similarly to electronic devices 100, 200, 300, and 400, as depicted in FIGS. 1, 2, 3, and 4, respectively. Specifically, the dies (e.g., dies 115 as depicted in FIG. 1) of the various microelectronic packages 110, 210, 310, and 410, as depicted in FIGS. 1, 2, 3, and 4, respectively, may be a component such as a processor 1502 or a memory 1504. The components may be communicatively coupled with one another by a waveguide such as waveguide 160 as depicted in FIG. 1 or one of waveguide assemblies 203, 303, or 403 as depicted in FIGS. 2, 3, and 4, respectively.

EXAMPLES OF VARIOUS EMBODIMENTS

Example 1 includes an electronic device comprising: a first platform coupled with a chassis, wherein the first platform includes a first microelectronic package; a second platform coupled with the chassis, wherein the second platform includes a second microelectronic package; and a waveguide positioned between, and coupled to, the first platform and the second platform such that the first microelectronic package is communicatively coupled with the second microelectronic package by the waveguide.

Example 2 includes the electronic device of example 1, wherein the first microelectronic package includes a processor die, a logic die, or a memory die that is communicatively coupled with the second platform by the waveguide.

Example 3 includes the electronic device of example 1, wherein the waveguide is a first waveguide, and wherein the first platform includes a second waveguide coupled with the first waveguide, wherein the second waveguide is communicatively positioned between the first waveguide and the first microelectronic package.

Example 4 includes the electronic device of example 3, wherein the first waveguide and the second waveguide are parallel to one another.

Example 5 includes the electronic device of any of examples 1-4, wherein the waveguide is a low-dispersion waveguide.

Example 6 includes the electronic device of any of examples 1-4, wherein the first platform includes a signal launcher communicatively coupled with the waveguide, wherein the signal launcher is to convert a signal received from the waveguide from a mode related to propagation through the waveguide to a mode related to propagation through the first microelectronic package.

Example 7 includes the electronic device of example 6, wherein the first platform includes a connector that physically and communicatively couples the signal launcher with the waveguide.

Example 8 includes the electronic device of any of examples 1-4, wherein the first microelectronic package includes a transceiver that is to convert a baseband signal to a high-frequency signal, and wherein the transceiver is further to transmit the high-frequency signal to the waveguide.

Example 9 includes the electronic device of example 8, wherein the high-frequency signal has a frequency of at least 20 gigahertz (GHz).

Example 10 includes the electronic device of example 8, wherein the high-frequency signal has a frequency of between 80 gigahertz (GHz) and 220 GHz.

Example 11 includes a computing device comprising: a first printed circuit board (PCB) coupled with a chassis, wherein the first PCB includes a first microelectronic package; a second PCB coupled with the chassis, wherein the second PCB includes a second microelectronic package; a third PCB coupled with the chassis such that the second PCB is physically between the first PCB and the third PCB, wherein the third PCB includes a third microelectronic package; and a waveguide coupled with the first PCB, the second PCB, and the third PCB, wherein the waveguide communicatively couples the first microelectronic package, the second microelectronic package, and the third microelectronic package.

Example 12 includes the computing device of example 11, wherein the waveguide can support a data rate of at least 10 gigabits per second (Gbps).

Example 13 includes the computing device of example 12, wherein the waveguide can support a data rate of at least 100 Gbps.

Example 14 includes the computing device of example 11, wherein the waveguide includes a splitter coupled with the second PCB, wherein the splitter communicatively couples the waveguide with the second microelectronic package.

Example 15 includes the computing device of example 11, wherein the waveguide includes a plurality of waveguide channels.

Example 16 includes the computing device of any of examples 11-15, wherein the first PCB and the second PCB are arranged face-to-face.

Example 17 includes the computing device of any of examples 11-15, wherein the first PCB and the second PCB are arranged back-to-face.

Example 18 includes the computing device of any of examples 11-15, wherein the first PCB and the second PCB are arranged back-to-back.

Example 19 includes a method of manufacturing a rack server with a plurality of server blades, the method comprising: coupling a first server blade to a chassis, wherein the first server blade includes a first microelectronic package; coupling a second server blade to the chassis, wherein the second server blade includes a second microelectronic package; coupling a first end of a waveguide to the first server blade such that the first microelectronic package is communicatively coupled with the first end of the waveguide; and coupling a second end of the waveguide to the second server blade such that the second microelectronic package is communicatively coupled with the second end of the waveguide.

Example 20 includes the method of example 19, wherein the waveguide is to convey an electromagnetic signal with a frequency of at least 20 gigahertz (GHz) between the first blade and the second blade.

Example 21 includes the method of example 19, wherein, once the first server blade and the second server blade are coupled with the waveguide, the first microelectronic package is communicatively coupled with the second microelectronic package.

Example 22 includes the method of any of examples 19-21, wherein the waveguide is coupled with the chassis, and wherein coupling the first server blade with the first end of the waveguide includes coupling the first server blade with a connector positioned on the chassis.

Example 23 includes the method of any of examples 19-21, wherein coupling the first server blade to the first end of the waveguide includes coupling the waveguide with a connector positioned on the first server blade.

Example 24 includes the method of any of examples 19-21, wherein the method further comprises: coupling a third server blade to the chassis such that the third server blade is positioned between the first server blade and the second server blade, wherein the third server blade includes a third microelectronic package; and communicatively coupling the third microelectronic package with a splitter of the waveguide such that the third microelectronic package is communicatively coupled with the first microelectronic package by the waveguide.

Example 25 includes a computing device comprising: a chassis with a waveguide coupled thereto; a first server blade coupled with the chassis, wherein the first server blade includes a first microelectronic package that is communicatively coupled with the waveguide; and a second server blade coupled with the chassis, wherein the second server blade includes a second microelectronic package that is communicatively coupled with the waveguide such that the first microelectronic package and the second microelectronic package are communicatively coupled with one another by the waveguide.

Example 26 includes the computing device of example 25, wherein the first microelectronic package includes a processor die, a logic die, or a memory die that is communicatively coupled with the second server blade by the waveguide.

Example 27 includes the computing device of example 25, wherein the waveguide is a first waveguide, and wherein the first server blade includes a second waveguide that communicatively couples the first waveguide and the first microelectronic package.

Example 28 includes the computing device of example 27, wherein the first server blades includes a signal launcher coupled with the second waveguide, wherein the signal launcher is to convert a signal from a mode related to propagation through the first microelectronic package to a mode related to propagation through the second waveguide.

Example 29 includes the computing device of any of examples 25-28, wherein the waveguide is a flexible waveguide cable.

Example 30 includes the computing device of any of examples 25-28, wherein the first microelectronic package is to transmit a signal to the second microelectronic package via the waveguide, and wherein the signal has a frequency of at least 20 gigahertz (GHz).

Example 31 includes the computing device of example 30, wherein the signal has a frequency between 100 GHz and 200 GHz.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated embodiments, including what is described in the Abstract, is not intended to be exhaustive or limiting as to the precise forms disclosed. While specific implementations of, and examples for, various embodiments or concepts are described herein for illustrative purposes, various equivalent modifications may be possible, as those skilled in the relevant art will recognize. These modifications may be made in light of the above detailed description, the Abstract, the Figures, or the claims.

The invention claimed is:

1. An electronic device comprising:
a first platform physically coupled with a chassis at a first vertical location, wherein the first platform includes a first microelectronic package disposed thereon and a first waveguide communicatively coupled with the first microelectronic package;
a second platform physically coupled with the chassis at a second vertical location, wherein the second platform is physically coupled to the chassis below the first platform, and wherein the second platform includes a second microelectronic package disposed thereon and a second waveguide communicatively coupled with the second microelectronic package; and
a third waveguide positioned between, and communicatively coupled to, the first waveguide on the first platform and the second waveguide on the second platform, wherein at least a portion of the third waveguide is oriented vertically, and wherein the first microelectronic package is communicatively coupled with the second microelectronic package by the first, second, and third waveguides.

2. The electronic device of claim 1, wherein the first microelectronic package includes a processor die, a logic die, or a memory die that is communicatively coupled with the second microelectronic package by the first, second, and third waveguides.

3. The electronic device of claim 1, wherein the first, second, and third waveguides are low-dispersion waveguides.

4. The electronic device of claim 1, wherein the first platform includes a signal launcher communicatively coupled with the first waveguide and the third waveguide, wherein the signal launcher is configured to convert a signal from a mode related to propagation through the first waveguide to a mode related to propagation through the third waveguide.

5. The electronic device of claim 4, wherein the first platform further includes a connector that physically and communicatively couples the signal launcher with the third waveguide.

6. The electronic device of claim 1, wherein the first microelectronic package further includes a transceiver that is configured to convert a baseband signal to a high-frequency signal, and wherein the transceiver is further configured to transmit the high-frequency signal to the first waveguide.

7. The electronic device of claim 6, wherein the high-frequency signal has a frequency of between 80 gigahertz (GHz) and 220 GHz.

8. The electronic device of claim 6, wherein the high-frequency signal has a frequency of at least 20 gigahertz (GHz).

9. A computing device comprising:
a first printed circuit board (PCB) physically coupled with a chassis at a first vertical location, wherein the first PCB includes a first microelectronic package electrically coupled to the first PCB and a first waveguide communicatively coupled with the first microelectronic package;
a second PCB physically coupled with the chassis at a second vertical location below the first PCB, wherein the second PCB includes a second microelectronic package electrically coupled to the second PCB and a second waveguide communicatively coupled with the second microelectronic package;
a third PCB physically coupled with the chassis at a third vertical location below the second PCB such that the second PCB is physically located between the first PCB and the third PCB, wherein the third PCB includes a third microelectronic package electrically coupled to the third PCB and a third waveguide communicatively coupled with the third microelectronic package; and
a fourth waveguide communicatively coupled with the first waveguide on the first PCB, the second waveguide on the second PCB, and the third waveguide on the third PCB, wherein at least a portion of the fourth waveguide is oriented vertically, and wherein the first, second, third, and fourth waveguides communicatively couple the first microelectronic package, the second microelectronic package, and the third microelectronic package to each other.

10. The computing device of claim 9, wherein the fourth waveguide includes a plurality of waveguide channels.

11. The computing device of claim 9, wherein the fourth waveguide can support a data rate of at least 10 gigabits per second (Gbps).

12. The computing device of claim 11, wherein the fourth waveguide can support a data rate of at least 100 Gbps.

13. The computing device of claim 9, wherein the second PCB further includes a splitter coupled with the fourth waveguide, wherein the splitter communicatively couples the fourth waveguide with the second waveguide.

14. A method of manufacturing a rack server with a plurality of server blades, the method comprising:
- coupling a first server blade to a vertical location on a chassis, wherein the first server blade includes a first microelectronic package and a first waveguide communicatively coupled with the first microelectronic package;
- coupling a second server blade to a location on the chassis below the first server blade, wherein the second server blade includes a second microelectronic package and a second waveguide communicatively coupled with the second microelectronic package;
- communicatively coupling a first end of a third waveguide to the first waveguide such that the first microelectronic package is communicatively coupled with the first end of the third waveguide by the first waveguide; and
- communicatively coupling a second end of the third waveguide to the second waveguide such that the second microelectronic package is communicatively coupled with the second end of the third waveguide by the second waveguide, wherein at least a portion of the third waveguide is oriented vertically between the first server blade and the second server blade.

15. The method of claim 14, wherein the method further comprises:
- coupling a third server blade to a location on the chassis such that the third server blade is positioned between the first server blade and the second server blade, wherein the third server blade includes a third microelectronic package and a fourth waveguide communicatively coupled with the third microelectronic package; and
- communicatively coupling the fourth waveguide with a splitter of the third waveguide such that the third microelectronic package is communicatively coupled with the first microelectronic package by the first, third, and fourth waveguides.

16. The method of claim 14, wherein the third waveguide is configured to convey an electromagnetic signal with a frequency of at least 20 gigahertz (GHz).

17. The method of claim 14, wherein the first microelectronic package is communicatively coupled with the second microelectronic package by the first waveguide, the second waveguide, and the third waveguide.

18. The method of claim 14, wherein the third waveguide is coupled within the chassis, and wherein coupling the first waveguide with the first end of the third waveguide includes coupling the first waveguide with a connector positioned on the chassis.

19. The method of claim 14, wherein coupling the first waveguide to the first end of the third waveguide includes coupling the third waveguide with a connector positioned on the first server blade.

* * * * *